(12) United States Patent
Flaig et al.

(10) Patent No.: US 11,444,426 B2
(45) Date of Patent: Sep. 13, 2022

(54) METHODS FOR PRODUCING A LASER PULSE AND DEVICES FOR PRODUCING A DRIVER CONTROL SIGNAL

(71) Applicant: TRUMPF LASER GMBH, Schramberg (DE)

(72) Inventors: Rainer Flaig, Eschbronn (DE); Oliver Rapp, Eschbronn (DE); Aleksander Budnicki, Gundelfingen (DE); Florian Jansen, Villingen-Schwenningen (DE); Daniel Glunk, Fluorn-Winzeln (DE)

(73) Assignee: TRUMPF LASER GMBH, Schramberg (DE)

( * ) Notice: Subject to any disclaimer, the term of this patent is extended or adjusted under 35 U.S.C. 154(b) by 323 days.

(21) Appl. No.: 16/244,608

(22) Filed: Jan. 10, 2019

(65) Prior Publication Data

US 2019/0148906 A1    May 16, 2019

Related U.S. Application Data

(63) Continuation of application No. PCT/EP2017/067621, filed on Jul. 12, 2017.

(30) Foreign Application Priority Data

Jul. 14, 2016    (DE) ........................ 102016212928.7

(51) Int. Cl.
| | |
|---|---|
| *H01S 3/10* | (2006.01) |
| *H01S 3/13* | (2006.01) |
| *H01S 5/042* | (2006.01) |
| *H01S 5/062* | (2006.01) |
| *H01S 3/102* | (2006.01) |
| *H01S 3/23* | (2006.01) |

(52) U.S. Cl.
CPC ........ *H01S 3/10015* (2013.01); *H01S 3/1024* (2013.01); *H01S 3/1307* (2013.01); *H01S 3/2308* (2013.01); *H01S 5/0428* (2013.01); *H01S 5/06216* (2013.01); *H01S 3/2375* (2013.01)

(58) Field of Classification Search
None
See application file for complete search history.

(56) References Cited

U.S. PATENT DOCUMENTS

| | | | |
|---|---|---|---|
| 9,048,622 B2 | 6/2015 | Nakai | |
| 2010/0177794 A1* | 7/2010 | Peng | ................. H01S 3/2316 372/25 |

(Continued)

FOREIGN PATENT DOCUMENTS

| | | |
|---|---|---|
| DE | 10 2006 060 368 | 7/2008 |
| WO | WO 2013/185792 | 12/2013 |
| WO | WO 2015/006867 | 1/2015 |

OTHER PUBLICATIONS

International Search Report and Written Opinion in International Application No. PCT/EP2017/067621, dated Feb. 27, 2018, 25 pages (with English translation).

*Primary Examiner* — Tod T Van Roy
(74) *Attorney, Agent, or Firm* — Fish & Richardson P.C.

(57) ABSTRACT

In methods and devices for generating a laser pulse of an excitation laser that is actuated by a driver in response to a triggering time of a trigger signal, the driver actuation signal is generated taking into account the time interval between the triggering time and a preceding triggering time.

15 Claims, 2 Drawing Sheets

(56) References Cited

U.S. PATENT DOCUMENTS

| | | | |
|---|---|---|---|
| 2012/0320450 A1* | 12/2012 | Starodoumov | H01S 3/1302 |
| | | | 359/341.1 |
| 2013/0183046 A1 | 7/2013 | Blanchette et al. | |
| 2014/0218791 A1 | 8/2014 | Desbiens et al. | |
| 2015/0010036 A1 | 1/2015 | Salin | |
| 2017/0187160 A1* | 6/2017 | Lowder | H01S 3/10092 |
| 2018/0041006 A1* | 2/2018 | Blauvelt | H01S 5/1028 |
| 2018/0364356 A1* | 12/2018 | Eichenholz | G01S 7/4804 |
| 2019/0305508 A1* | 10/2019 | Onose | H01S 3/109 |
| 2020/0321747 A1* | 10/2020 | Hatta | H01S 5/0651 |

\* cited by examiner

111# METHODS FOR PRODUCING A LASER PULSE AND DEVICES FOR PRODUCING A DRIVER CONTROL SIGNAL

CROSS REFERENCE TO RELATED APPLICATIONS

This application is a continuation of and claims priority under 35 U.S.C. § 120 from PCT Application No. PCT/EP2017/067621 filed on Jul. 12, 2017, which claims priority from German Application No. DE 10 2016 212 928.7, filed on Jul. 14, 2016. The entire contents of each of these priority applications are incorporated herein by reference.

TECHNICAL FIELD

The disclosure relates to methods for producing a laser pulse of an excitation laser in response to an actuation time of an actuation signal.

BACKGROUND

In laser systems, excitation lasers are controlled by a driver. The output signal of the excitation laser is amplified by an optical amplifier and subsequently output. Excitation lasers and optical amplifiers together constitute a laser system. Such laser systems are often operated in a pulsed manner. In some instances, however, the pulse energy of several pulses at the laser output may vary in spite of driver control signals of the same length and same strength.

SUMMARY

The current disclosure provides methods and laser systems that generate a laser having a predetermined, e.g., a substantially constant, pulse energy. The new methods include producing a laser pulse of an excitation laser in response to an actuation time of an actuation signal, wherein the excitation laser is controlled by a driver and the driver control signal is produced taking into account the time interval of the actuation time or laser pulse with respect to a previous actuation time or laser pulse. It is possible to use as an excitation laser, for example, a seed laser or a seed diode. An actuation time is also often referred to as a trigger time.

At least a portion of the oscillation of the pulse energy of a plurality of pulses at the laser output, in spite of identical driver control signals, is brought about by the time interval of the actuation time with respect to a previous actuation time or laser pulse. With pulsed lasers, the time intervals between the actuation times of the actuation signal can vary, and thus, the time intervals between the laser pulses may vary. Since the laser pulses of the excitation laser are amplified to differing degrees depending on the time interval between the pulses, the pulse energy of a plurality of pulses at the laser output can have different power levels in spite of identical driver control signals. The reason for this result is that the gain level of the optical amplifier is dependent on the pumping time between the pulses. The longer the pumping operation, the more energy is extracted.

As a result of the fact that the time interval of the actuation times or laser pulses is taken into account for the production of the driver control signal, the driver control signal can be adjusted such that laser pulses with constant pulse energy are generated at the output of the laser. It is thereby possible to adapt or scale the control of the excitation laser, which enables a compensation of the gain level in the optical amplifier. It is thereby possible for the power of the excitation laser to be adapted in accordance with the spacing of the actuation times or laser pulses.

The driver control signal can be produced taking into account the properties of an optical amplifier that is controlled by the excitation laser. From the time interval of the actuation times or laser pulses, it is possible to draw conclusions regarding the state of the optical amplifier. Conclusions can be drawn regarding the gain level of the optical amplifier. The driver control signal can accordingly be generated in such a manner that, taking into account the gain level of the optical amplifier and consequently the properties of the optical amplifier, laser pulses with a predetermined, e.g., constant, energy are produced.

The driver control signal can be produced by a digitally encoded pulse shape being compensated by a digitally encoded compensation signal. In this instance, the digitally encoded compensation signal can further be dependent on the time interval of the actuation time or laser pulse with respect to the previous actuation time or laser pulse. In this instance, the compensated digitally encoded pulse shape can further be converted into an analog signal. Normally, it is the case that, when a trigger time occurs from a pulse shape store, a digitally encoded pulse shape is read and subsequently converted into an analog signal, by which a driver is controlled. If this is done without taking into account the state of the optical amplifier, laser pulses with different energies are produced in the output of the laser. In some embodiments, before the analog signal is generated, the digitally encoded pulse shape can be modified with a digitally encoded compensation signal to produce a driver control signal. This can lead to pulses with predetermined, e.g., constant, energy being output or generated at the output of the laser. Since the state of the optical amplifier can depend on the time interval of the actuation times or laser pulses, a suitable encoded compensation signal is determined with reference to the interval of the actuation times or laser pulses.

In this instance, the digitally encoded compensation signal can be read in accordance with the time interval of the actuation time or laser pulse with respect to the or a previous actuation time or laser pulse from a compensation signal store.

Alternatively, the driver control signal can be produced by a pulse shape from a digitally encoded pulse shape by digital/analog conversion being compensated with a compensation signal. In this instance, the compensation signal can be dependent on the time interval of the actuation time or laser pulse with respect to a previous actuation time or laser pulse. In this instance, the compensation for the pulse shape or the driver control signal can be carried out in the analog range.

A time-dependent factor in the range 0<factor≤1 can be used as a compensation signal. Depending on how much time there is between the actuation times or laser pulses, the pulse shape is multiplied by a factor between 0 and 1.

The compensation signal can be reset in a time-delayed manner with respect to the actuation time. The compensation signal can be reset at the end of the produced pulse shape. Consequently, from this time, the time-dependent factor can also be reduced in a time-dependent manner from 1 to 0. The more time consequently elapses between two actuation times or laser pulses, the more powerfully the pulse shape is compensated for or corrected.

The time interval between the actuation time or laser pulse and the previous actuation time or laser pulse can be determined and, taking into account the determined time interval, a driver control signal shape determined.

In another aspect, this disclosure includes devices for producing a driver control signal for controlling a driver that controls an excitation laser, having an actuation signal input and a driver signal output. In this instance, the actuation signal input is connected to a pulse shape store and at least indirectly to a compensation signal establishment means. Furthermore, the actuation signal input is connected to a scaling device, to which the pulse shape and the compensation signal are supplied and configured to generate a driver control signal. With this arrangement, it is possible to determine a compensated driver control signal such that an excitation laser is controlled with a driver control signal and at the output of the laser pulses with a predetermined, e.g., constant, energy are always generated. The pumping time of an optical amplifier of the laser can be taken into account.

The actuation signal input can be connected via a delay member to the compensation signal establishment means. Consequently, a correction of the driver control signal can be carried out in a time-delayed manner.

The compensation signal establishment means can include a compensation signal store. Depending on the time interval between actuation times, different compensation signals can be taken from the compensation signal store and consequently a pulse shape can be compensated for or corrected. In some embodiments, only one compensation signal shape is stored in the compensation signal store. In this instance, the compensation signal can be time-dependent so that a time-dependent compensation of the pulse shape can be carried out.

The scaling device can include a multiplier. Depending on whether the compensation is carried out in the digital domain or in the analog domain, the multiplier can be a digital or an analog multiplier, respectively.

The compensation signal establishment means can include a resettable counter. Furthermore, depending on the counter, a compensation signal can be read from the compensation signal store. The resettable counter can be reset to an actuation time. From then, the counter counts upwards or downwards at a predetermined rate. In this instance, depending on the counter status, at the next actuation time a compensation signal can be read from the compensation signal store and used to compensate a pulse shape.

In another aspect, the disclosure further includes laser systems having a laser that includes an excitation laser controlled by a driver, and a device for producing a driver control signal as described herein connected to the driver.

Other features and advantages will be appreciated from the following detailed description with reference to the drawings, and from the claims. The features shown therein are not necessarily intended to be understood to be to scale and are depicted in such a manner that the specific features can be made clearly visible. The different features can be implemented individually per se or together in any combinations in variants.

DETAILED DESCRIPTION

Figure 1:
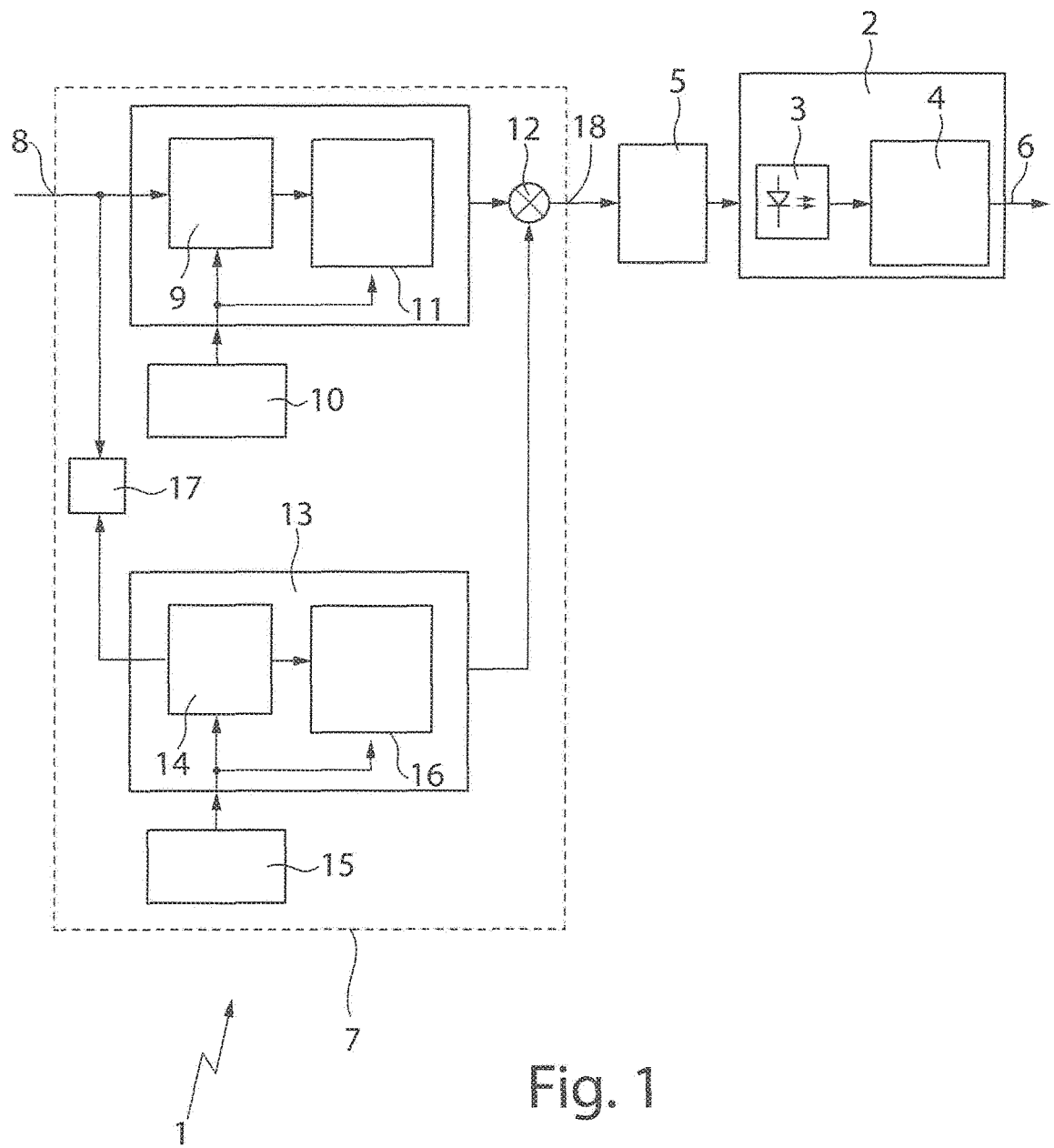
FIG. 1 shows a laser system having a first embodiment of a device for producing a driver control signal for controlling a driver of an excitation laser.

FIG. 1 shows a laser system 1 having a laser 2 that has an excitation laser 3 and an optical amplifier 4. The excitation laser 3 may, for example, be a seed diode. The excitation laser 3 is controlled by a driver 5. The output signal of the excitation laser 3 is amplified by an optical amplifier 4, to which a pump light is also supplied, so that at the output 6 laser light, e.g., a laser pulse, can be output or generated.

A device 7 for producing a laser pulse is used to control the driver 5. The device 7 has an actuation signal input 8, at which an actuation signal is supplied. It is possible to use as an actuation signal, for example, a pulse signal, where the time of the occurrence of a rising flank can represent an actuation time. The actuation signal is supplied to a pulse shape store 9 that is clocked by a clock source 10. When an actuation time of the actuation signal occurs, from the pulse shape store 9 a digitally encoded pulse shape is output at the rate of the clock source 10. This is supplied to a digital/analog converter 11. The digital/analog converter 11 converts the digitally encoded pulse shape into an analog pulse shape. The analog pulse shape is supplied to a scaling device 12. If the analog pulse shape were to be used directly as a driver control signal that is supplied to the driver 5, laser pulses with different energy could be generated at the output 6 of the laser, because the pulse shape or energy of the laser pulse can be dependent on the state of the optical amplifier 4. Depending on the time intervals at which actuation times occur, the gain level of the optical amplifier 4 is potentially different so that different laser pulses can also be output. To prevent this result, the device 7 has a compensation signal establishment means 13. The compensation signal establishment means 13 has a compensation signal store 14. The compensation signal store 14 is timed by a clock source 15. The compensation signal establishment means 13 can further have a digital/analog converter 16.

The actuation signal from the actuation signal input 8 is supplied to the compensation signal store 14 in a time-delayed manner brought about by the delay member 17. When the delayed actuation signal arrives at the compensation signal store 14, a digitally encoded compensation signal is output therefrom at the rate of the clock source 15. The digitally encoded compensation signal is transferred to the digital/analog converter 16. There, an analog compensation signal is produced. The analog compensation signal is supplied to the scaling device 12.

In the embodiment shown, the scaling device 12 is a multiplier so that the pulse shape that is output by the analog/digital converter 11 is multiplied by the compensation signal. A time-dependent pulse shape scaling is thereby carried out. The pulse shape that is thus compensated at the output of the scaling device 12 or at the driver signal output 18 now represents a driver control signal that is supplied to the driver 5. Depending on the time interval between two actuation times of the actuation signal, there is produced a compensation signal by which a pulse shape is compensated. From this, a driver control signal is generated and takes into account the state of the optical amplifier 4 so that at the output 6 laser pulses with a constant energy are always generated. The compensation signal that is stored in the compensation signal store 14 is advantageously selected in accordance with the properties of the optical amplifier, e.g., the gain level thereof depending on the pump time between two pulses.

Figure 2:
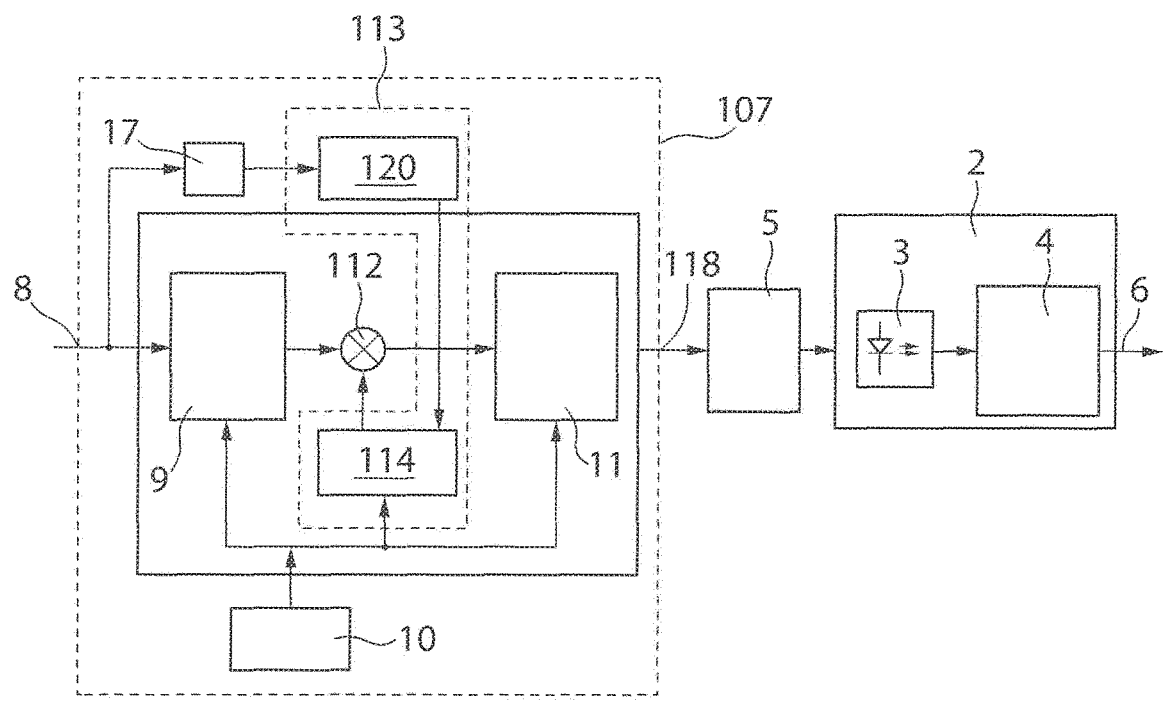
FIG. 2 shows a laser system having a second embodiment of a device for producing a driver control signal for controlling a driver of an excitation laser.

FIG. 2 shows an alternative embodiment of a laser system 100. Elements that correspond to those of FIG. 1 are given the same reference numeral.

A device 107 has an actuation signal input 8. An actuation signal can be supplied via the actuation signal input 8 to a pulse shape store 9. At the rate of a clock source 10, from the pulse shape store 9 at an actuation time of the actuation signal a digitally encoded pulse shape is produced. The digitally encoded pulse shape is supplied to a scaling device 112. The actuation signal is supplied via a delay member 17 to a compensation signal establishment means 113. The actuation signal is supplied to a counter 120. The counter 120 is a resettable counter. This resettable counter can always be reset when an actuation time occurs and can then count upwards or downwards depending on the embodiment. According to the counter status, before resetting the counter 120 a digitally encoded compensation signal can be read from a compensation signal store 114. This digitally encoded compensation signal is supplied to the scaling device 112 so that with this signal the digitally encoded pulse shape can be compensated, e.g., multiplied thereby. The digitally encoded signal produced by the scaling device 112, e.g., a compensated digitally encoded pulse shape, is supplied to a digital/analog converter 11. The digital/analog converter 11 can generate an analog signal from this. The analog signal corresponds to a driver control signal and can accordingly be supplied to the driver 5 via the driver signal output 118.

Figure 3:
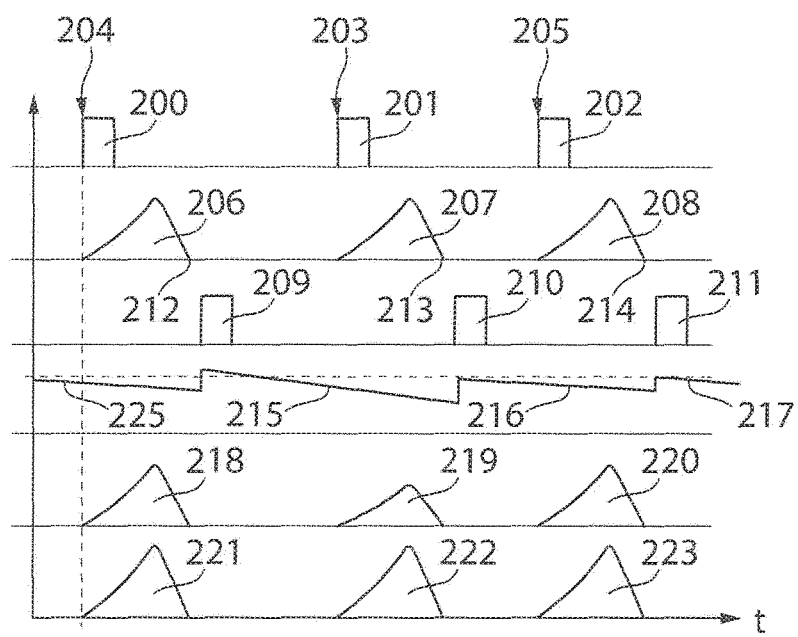
FIG. 3 shows different signal paths for explaining the method and the operating method of the laser systems.

FIG. 3 shows signal shapes to explain the method. In the first line, an actuation signal is illustrated, where the actuation signal has individual pulses 200, 201, 202. The rising flank 203 of the pulse 201 represents an actuation time. The rising flank 204 of the pulse 200 accordingly represents a previous actuation time. If the actuation times 203, 204, 205 occur, for example, pulse shapes 206, 207, 208 are produced in accordance with FIG. 1 at the output of the digital/analog converter 11.

In a time-offset manner with respect to the actuation times 203 to 205, at the output of the delay member 17, pulses 209 to 211 are present. The delay member 17 can thus be selected in such a manner that the rising flank of the pulses 209 to 211 in each case coincides with the end 212 to 214 of the pulse shapes 206 to 208. In some embodiments, the pulses 209 to 211 can be actuated at the end 212 to 214 of the pulse shapes 206 to 208. When the pulses 209 to 211 occur, a time-dependent compensation signal 215 to 217 is produced in each case. At an earlier time that is not shown, the compensation signal 225 was produced. In the embodiment shown, the compensation signals are a signal shape with a declining straight line. In the case of a rising flank of one of the pulses 209 to 211, the compensation signal 225, 215, 216, 217 is output with the value 1 and then falls in a linear manner over time.

To produce a driver control signal 218 to 220, the compensation signals 225, 215, 216 are multiplied by the pulse shapes 206 to 208. Since the time interval between the pulses 200 and 201 or 209 and 210 is greater than the time interval between the pulses 201 and 202 or 210 and 211, the pulse shape 207 is multiplied by a lower value than the pulse shape 208. This is a result of the fact that, at the beginning of the pulse shape 207, the compensation signal 215 has fallen further than the compensation signal 216 has fallen at the beginning of the pulse shape 208. Accordingly, the compensation signal 219 that has been produced from a multiplication of the pulse shape 207 by the compensation signal 215 has a lower amplitude than the driver control signal 220 that has been produced from a multiplication of the pulse shape 208 by the compensation signal 216. Nonetheless, the laser pulses 221 to 223 have the same shape. The laser pulses 221 to 223 are generated at the output 6 (FIGS. 1, 2). As a result of the multiplication of the pulse shapes 206 to 208 by the compensation signals 225, 215, 216, the spacing between the rising flanks of the pulses 200, 201, 202 and consequently the time-dependent state of the optical amplifier 4 has been taken into account. This can be carried out in such a manner that, at the output 6 of the laser, laser pulses with predetermined, in the present example with constant, energy are always produced.

OTHER EMBODIMENTS

A number of embodiments of the invention have been described. Nevertheless, it will be understood that various modifications may be made without departing from the spirit and scope of the invention. Accordingly, other embodiments are within the scope of the following claims.

What is claimed is:

1. A method for producing laser pulses of an excitation laser, the method comprising:
   receiving an actuation signal or a laser pulse,
   producing a driver control signal for a driver taking into account a time interval of an actuation time of the actuation signal or the laser pulse with respect to an actuation time of a previously received actuation signal or a previous laser pulse, and
   controlling the excitation laser by the driver based on the driver control signal,
   wherein producing the driver control signal comprises compensating for a pulse shape corresponding to the actuation signal or the laser pulse with a compensation signal, and wherein the compensation signal is set in a time-delayed manner with respect to the actuation time of the actuation signal or the laser pulse, is determined based on the time interval, and comprises a declining signal shape during the time interval, such that the pulse shape corresponding to a greater time interval is compensated with a corresponding lower value of the compensation signal, or the pulse shape corresponding to a smaller time interval is compensated with a corresponding higher value of the compensation signal.

2. The method of claim 1, wherein the driver control signal is produced taking into account properties of an optical amplifier controlled by the excitation laser.

3. The method of claim 1, wherein the pulse shape comprises a digitally encoded pulse shape, and the compensation signal comprises a digitally encoded compensation signal, and
   wherein producing the driver control signal comprises:
      compensating for the digitally encoded pulse shape with the digitally encoded compensation signal, wherein the digitally encoded compensation signal is dependent on the time interval, and
      converting the compensated digitally encoded pulse shape into an analog signal that corresponds to the driver control signal.

4. The method of claim 3, comprising reading the digitally encoded compensation signal in accordance with the time interval from a compensation signal store.

5. The method of claim 1, wherein the pulse shape comprises an analog pulse shape, and
   wherein producing the driver control signal comprises producing the analog pulse shape from a digitally encoded pulse shape by digital to analog conversion that is compensated for with the compensation signal.

6. The method of claim 5, further comprising resetting the compensation signal at an end of the produced pulse shape.

7. The method of claim 1, wherein the compensation signal corresponds to a time-dependent factor in a range $0<\text{factor}\leq 1$.

8. The method of claim 1, wherein producing the driver control signal comprises determining a driver control signal shape of the driver control signal based on the time interval.

9. A device for producing driver control signals for controlling a driver that controls an excitation laser, the device comprising:
- an actuation signal input configured to receive an actuation signal or a laser pulse,
- a driver signal output coupled to the driver,
- a compensation signal establishment means configured to provide a compensation signal,
- a pulse shape store connected to the actuation signal input and at least indirectly to the compensation signal establishment means and configured to provide a pulse shape corresponding to the actuation signal or the laser pulse, and
- a scaling device to which the pulse shape and the compensation signal are supplied and that is configured for generation of a driver control signal at the driver signal output by compensating the pulse shape with the compensation signal, wherein the compensation signal is determined based on a time interval of an actuation time of the actuation signal or the laser pulse with respect to an actuation time of a previously received actuation signal or a previous laser pulse, is set in a time-delayed manner with respect to the actuation time of the actuation signal or the laser pulse, and comprises a declining signal shape during the time interval, such that the pulse shape corresponding to a greater time interval is compensated with a corresponding lower value of the compensation signal, or the pulse shape corresponding to a smaller time interval is compensated with a corresponding higher value of the compensation signal.

10. The device of claim 9, wherein the actuation signal input is connected via a delay member to the compensation signal establishment means.

11. The device of claim 9, wherein the compensation signal establishment means comprises a compensation signal store.

12. The device of claim 11, wherein the compensation signal establishment means comprises a resettable counter and, depending on the resettable counter, a compensation signal is read from the compensation signal store.

13. The device of claim 9, wherein the scaling device comprises a multiplier.

14. A laser system comprising:
- a laser that has an excitation laser,
- a driver that controls the excitation laser, and
- a device for producing a driver control signal connected to the driver, the device comprising:
  - an actuation signal input configured to receive an actuation signal or a laser pulse,
  - a driver signal output coupled to the driver,
  - a compensation signal establishment means configured to provide a compensation signal,
  - a pulse shape store connected to the actuation signal input and at least indirectly to the compensation signal establishment means and configured to provide a pulse shape corresponding to the actuation signal or the laser pulse, and
  - a scaling device to which the pulse shape and the compensation signal are supplied and that is configured for generation a driver control signal at the driver signal output by compensating the pulse shape with the compensation signal, wherein the compensation signal is determined based on a time interval of an actuation time of the actuation signal or the laser pulse with respect to an actuation time of a previously received actuation signal or a previous laser pulse, is set in a time-delayed manner with respect to the actuation time of the actuation signal or the laser pulse, and comprises a declining signal shape during the time interval, such that the pulse shape corresponding to a greater time interval is compensated with a corresponding lower value of the compensation signal, or the pulse shape corresponding to a smaller time interval is compensated with a corresponding higher value of the compensation signal.

15. The laser system of claim 14, wherein the laser comprises an optical amplifier coupled to the excitation laser, and
wherein the driver control signal is generated by taking into account one or more properties of the optical amplifier, such that laser pulses with a constant energy are produced by the laser, the one or more properties of the optical amplifier comprising a gain level of the optical amplifier.

* * * * *